(12) United States Patent
Isono et al.

(10) Patent No.: US 8,458,580 B2
(45) Date of Patent: Jun. 4, 2013

(54) MAGNETIC DISC CONTROLLER AND METHOD

(75) Inventors: Soichi Isono, Naka-gun (JP); Minoru Tsukada, Hiratsuka (JP); Tomoki Oura, Chigasaki (JP); Koji Takahashi, Yokohama (JP)

(73) Assignee: Marvell World Trade Ltd., St. Michael (BB)

( * ) Notice: Subject to any disclaimer, the term of this patent is extended or adjusted under 35 U.S.C. 154(b) by 1205 days.

(21) Appl. No.: 12/024,914

(22) Filed: Feb. 1, 2008

(65) Prior Publication Data

US 2008/0189590 A1 Aug. 7, 2008

Related U.S. Application Data

(60) Provisional application No. 60/889,182, filed on Feb. 9, 2007.

(30) Foreign Application Priority Data

Feb. 1, 2007 (JP) .................................. 2007-023006

(51) Int. Cl.
*H03M 13/00* (2006.01)
*G11B 5/09* (2006.01)

(52) U.S. Cl.
USPC ............... 714/807; 714/758; 360/39; 360/53; 360/55; 365/185.09; 365/185.12

(58) Field of Classification Search
None
See application file for complete search history.

(56) References Cited

U.S. PATENT DOCUMENTS

| | | | | |
|---|---|---|---|---|
| 6,421,274 B1* | 7/2002 | Yoshimura | ............... | 365/185.12 |
| 6,437,937 B1* | 8/2002 | Guo et al. | ............... | 360/78.05 |
| 6,438,319 B1* | 8/2002 | Inoue et al. | ............... | 386/265 |
| 2004/0037187 A1* | 2/2004 | Kondo et al. | ............... | 369/47.33 |
| 2004/0093551 A1* | 5/2004 | Asano | ............... | 714/765 |
| 2007/0220402 A1* | 9/2007 | Hagi et al. | ............... | 714/766 |
| 2007/0283217 A1* | 12/2007 | Gorfajn et al. | ............... | 714/758 |
| 2010/0088576 A1* | 4/2010 | Isono et al. | ............... | 714/770 |
| 2011/0063748 A1* | 3/2011 | Song et al. | ............... | 360/39 |

FOREIGN PATENT DOCUMENTS

JP 2007-023007 1/2007

* cited by examiner

*Primary Examiner* — Albert Decady
*Assistant Examiner* — Justin R Knapp

(57) ABSTRACT

A magnetic disk controller includes an error check code generating unit that generates error check codes associated with the encoded pieces of writing data; a first buffer that stores a first encoded piece of writing data and a first error check code associated with the first encoded piece; a second buffer that stores a second encoded piece of writing data and a second error check code associated with the second encoded piece; and a buffer control unit that, in a first period, substantially concurrently with a writing of the first encoded piece and the first error check code from the first buffer into a first sector of the magnetic disk, stores the second encoded piece and the second error check code into the second buffer.

15 Claims, 9 Drawing Sheets

MAGNETIC DISC CONTROLLER AND METHOD

RELATED APPLICATIONS

This application claims priority from Japanese patent application serial number 2007-023006, filed Feb. 1, 2007, and from U.S. Provisional Patent Application No. 60/889,182, filed Feb. 9, 2007, the entire contents of both of which applications are incorporated herein by reference.

BACKGROUND

This specification relates to a magnetic disk controller and a method. More particularly, this specification relates to a magnetic disk controller and a method for controlling writing of data to a magnetic disk.

When reading data from a sector of a magnetic disk, a magnetic disk controller can transfer identification information regarding the sector before transferring the data of the sector.

When writing data from a host into a magnetic disk, a conventional magnetic disk controller obtains the address of a sector to which the data is to be written, and calculates an error check code based on the obtained address and the data to be written into the sector. Hence, the magnetic disk controller cannot write the data and error check code into the sector immediately after obtaining the address of the sector. Accordingly, the magnetic disk controller holds off on the writing of the data and error check code until the sector comes back to the position of the magnetic head, which delays the writing of the data and error check code.

SUMMARY

In general, one aspect of the subject matter described in this specification can be embodied in a magnetic disk controller that includes an encoding unit that encodes a plurality of pieces of writing data into a plurality of encoded pieces of writing data; an error check code generating unit that generates to generate error check codes associated with the encoded pieces of writing data; a first buffer that stores a first encoded piece of writing data and a first error check code associated with the first encoded piece, where the first encoded piece is encoded by the encoding unit from a first piece of writing data and the first error check code is generated by the error check code generating unit; a second buffer that stores a second encoded piece of writing data and a second error check code associated with the second encoded piece, where the second encoded piece is encoded by the encoding unit from a second piece of writing data and the second error check code is generated by the error check code generating unit; and a buffer control unit that, in a first period, substantially concurrent with a writing of the first encoded piece and the first error check code from the first buffer into a first sector of the magnetic disk, stores the second encoded piece and the second error check code into the second buffer. Other embodiments of this aspect include corresponding methods, apparatus, systems, and computer readable media.

In general, another aspect of the subject matter described in this specification can be embodied in a method that includes sequentially encoding a plurality of pieces of writing data into a plurality of encoded pieces of writing data, where the plurality of encoded pieces of writing data includes a first encoded piece of writing data and a second encoded piece of writing data; substantially sequentially generating a plurality of error check codes associated with the plurality of encoded pieces of writing data, where the plurality of error check codes includes a first error check code associated with the first encoded piece and a second error check code associated with the second encoded piece; storing, into a first buffer, the first encoded piece and the first error check code; and substantially concurrently, in a first period, writing the first encoded piece and the first error check code from the first buffer into a first sector of a magnetic disk, and storing the second encoded piece and the second error check code into a second buffer. Other embodiments of this aspect include corresponding apparatus, systems, and computer readable media.

The details of one or more embodiments of the subject matter described in this specification are set forth in the accompanying drawings and the description below. Other features, aspects, and advantages of the subject matter will become apparent from the description, the drawings, and the claims.

DETAILED DESCRIPTION

Figure 1:
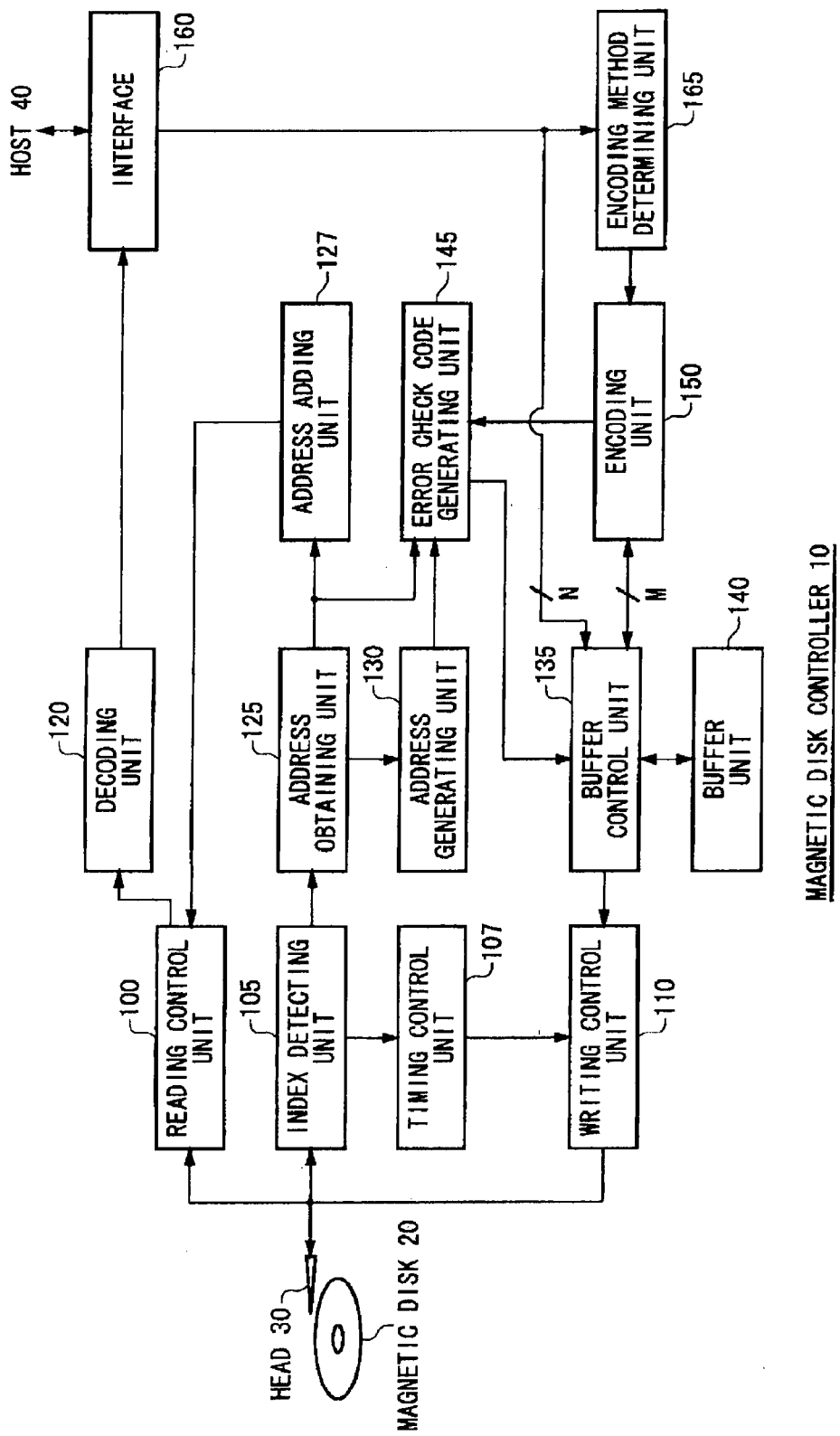
FIG. 1 is a block diagram showing an example magnetic disk controller 10.

FIG. 1 illustrates an example magnetic disk controller 10. The magnetic disk controller 10 can receive data from a host 40, and can write data into a magnetic disk 20. In other words, the magnetic disk controller 10 controls the writing of data into the magnetic disk 20. The host 40 can be a host computer, and can execute a command and data transmission/reception, by accessing a register group of a magnetic disk apparatus, e.g., the magnetic disk 20. The register group can include a control block register group and a command block register group.

An advantage of the magnetic disk controller 10 shown in FIG. 1 is that data and an error check code can be written into a magnetic disk immediately after generating the error check code based on the data.

The magnetic disk controller 10 includes a reading control unit 100, an index detecting unit 105, a timing control unit 107, a writing control unit 110, a decoding unit 120, an address obtaining unit 125, an address adding unit 127, an address generating unit 130, a buffer control unit 135, a buffer unit 140, an error check code generating unit 145, an encoding unit 150, an interface 160, and an encoding method determining unit 165. In some implementations, the magnetic disk 20 is a hard disk. In some other implementations, the magnetic disk 20 can be another type of magnetic storage medium.

The interface 160 transfers data to be written into the magnetic disk 20. For example, the interface 160 receives, from the host 40, data to be written into the magnetic disk 20, and transfers the data to the buffer control unit 135 and encoding method determining unit 165. Also, the interface 160 can receive data from the decoding unit 120, and transfers the received data to the host 40. The index detecting unit 105 detects, through the head 30, the index of the magnetic disk 20. The index detecting unit 105 provides a signal representing a timing of the detection of the index to the address obtaining unit 125 and timing control unit 107.

The address generating unit 130 sequentially generates a physical address of a sector in accordance with a time period of a detection of the index by the index detecting unit 105. For example, the address generating unit 130 receives, through the address obtaining unit 125, a signal representing the timing of the detection of the index from the index detecting unit 105, and sequentially generates a physical address of a sector in synchronization with the rotation of the magnetic disk 20. The address generating unit 130 sequentially provides the generated physical address to the error check code generating unit 145. The address obtaining unit 125 obtains a physical address of the magnetic disk 20 on which data can be stored. The address obtaining unit 125 provides the obtained physical address to the address adding unit 127 and error check code generating unit 145. Also, the address obtaining unit 125 provides the signal representing the timing of the detection of the index, which is received from the index detecting unit 105, to the address generating unit 130.

The error check code generating unit 145 generates one or more error check codes for detecting errors in a piece of writing data. For example, the error check code generating unit 145 generates, after the index detecting unit 105 detects the index, an error check code (e.g., cyclic redundancy check (CRC) code) for a writing data (i.e., data to be written to the magnetic disk 20). The error check code is generated based on the writing data and a physical address of a sector subsequent to the detected index. In some implementations, the error check code generating unit 145 generates an error check code based on encoded data created by the encoding unit 150. In some implementations, the error check code generating unit 145 generates, after the index detecting unit 105 detects the index, an error correction code (e.g., error-correcting code (ECC) code) for the writing data based on the writing data and the physical address of the first sector subsequent to the detected index.

The error check code generating unit 145 can generate an error check code for a writing data based on the writing data and the physical address of the first sector that is adjacent to the detected index. In some implementations, the error check code generating unit 145 generates a first error check code for a first writing data based on the first writing data and the physical address of a first sector, where the physical address is generated by the address generating unit 130 in synchronization with the rotation of the magnetic disk 20. In some implementations, the error check code generating unit 145 further generates a second error check code for a second writing data based on the second writing data and the physical address of a second sector, where the physical address is generated by the address generating unit 130. The error check code generating unit 145 provides a generated error check code and/or a generated error correction code, to the buffer control unit 135.

The timing control unit 107 controls the timing at which the writing control unit 110 writes data into the magnetic disk 20, in accordance with the timing at which the index detecting unit 105 detects the index. The writing control unit 110 writes the data received from the buffer control unit 135 into the magnetic disk 20 through the head 30, at a timing controlled by the timing control unit 107. For example, the writing control unit 110 controls the head 30 so as to write the first error check code (which is generated by the error check code generating unit 145), the first writing data, and the first physical address into a second sector subsequent to the first sector.

In some implementations, the writing control unit 110 causes the first error check code (which was generated by the error check code generating unit 145), the first writing data, and the first physical address to be written into the second sector, which is adjacent to the first sector, where the first sector is on the opposite side to the index detected by the index detecting unit 105. In addition, the writing control unit 110 causes the second error check code (which was generated by the error check code generating unit 145), the second writing data, and the second physical address to be written into a third sector subsequent to the second sector. For example, the writing control unit 110 causes the second error check code, the second writing data, and the second physical address to be written into the third sector which is adjacent to the second sector, where the second sector is on the opposite side to the first sector.

The address adding unit 127 adds a predetermined value to a physical address obtained by the address obtaining unit 125. For example, the address adding unit 127 adds "1" to the physical address obtained by the address obtaining unit 125. When the error check code generating unit 145 requires a longer time period than a predetermined time period to generate an error correction code and/or an error check code, the address adding unit 127 may add an integer other than "1" (for example, integers larger than "1", such as "2" and "3") to the physical address obtained by the address obtaining unit 125. The address adding unit 127 provides the result of the addition to the reading control unit 100. The reading control unit 100 causes data to be read from a sector corresponding to the physical address generated by the address adding unit 127. The reading control unit 100 provides the read data to the decoding unit 120.

The buffer unit 140 includes at least one buffer for temporarily storing data to be written into the magnetic disk 20. The buffer unit 140 is controlled by the buffer control unit 135 so as to cause the at least one buffer to store temporarily the data to be written into the magnetic disk 20. The buffer unit 140 provides the data stored on the buffer, to the buffer control unit 135.

The buffer control unit 135 controls the storing of data onto or the reading of data from the buffer included in the buffer unit 140. The buffer control unit 135 provides the data received from the buffer unit 140 to the encoding unit 150, and causes the encoded data from the encoding unit 150 to be stored onto the buffer included in the buffer unit 140. In addition, the buffer control unit 135 stores the error check code generated by the error check code generating unit 145 into the buffer included in the buffer unit 140. The buffer control unit 135 reads the data stored on the buffer included in the buffer unit 140, and provides the read data to the writing control unit 110.

The encoding method determining unit 165 receives data to be written into the magnetic disk 20 from the interface 160, and determines an encoding method based on the received data. Alternatively, the encoding method determining unit 165 can transfer, to the encoding unit 150, the encoding method designated in advance by a user, independently from the data. The encoding method determining unit 165 determines encoding methods to be used by the encoding unit 150 to encode one or more pieces of writing data to be written into one or more sectors included in the magnetic disk 20, in such a manner that the encoding methods correspond to the pieces of writing data in a one-to-one correspondence. For example, the encoding method determining unit 165 determines an appropriate encoding method by varying one or more factors, including a minimum magnetization reversal interval, a maximum magnetization reversal interval, a bit length of original data, and a bit length of encoded data, for example. For example, the encoding method determining unit 165 may choose an encoding method that uses run length limited (RLL) coding. The encoding method determining unit 165 provides information representing the determined encoding methods to the encoding unit 150.

The encoding unit 150 sequentially encodes the one or more pieces of writing data to be written into the one or more sectors included in the magnetic disk 20 to create one or more pieces of data, each representing a signal to be applied to the magnetic disk 20. For example, the encoding unit 150 uses the encoding method determined by the encoding method determining unit 165 in order to encode, and thus convert, the data (original data) received from the buffer control unit 135 into a different sequence of data that has a lower error rate than the original data. The encoding unit 150 provides the encoded data to the buffer control unit 135 and error check code generating unit 145. The decoding unit 120 decodes the encoded data stored on the magnetic disk 20, which is received from the reading control unit 100, into the original data, and provides the decoded data to the interface 160. Here, the data width is M between the encoding unit 150 and buffer control unit 135, and the data width is N between the interface 160 and the buffer control unit 135, where the data width M may be equal to or larger than twice the data width N.

According to the example magnetic disk controller 10 described above, the writing control unit 110 can write the error check code generated by the error check code generating unit 145 into the second sector subsequent to the first sector. This means that the error check code for the first sector is not stored on the first sector. Therefore, the magnetic disk controller 10 does not need to keep on hold the writing of the error check code for the first sector until the magnetic disk 20 rotates so that the first sector comes back to the head 30. As a consequence, the present embodiment can reduce a time period from when writing data is obtained to when the error check code is written into the magnetic disk 20.

Figure 2:
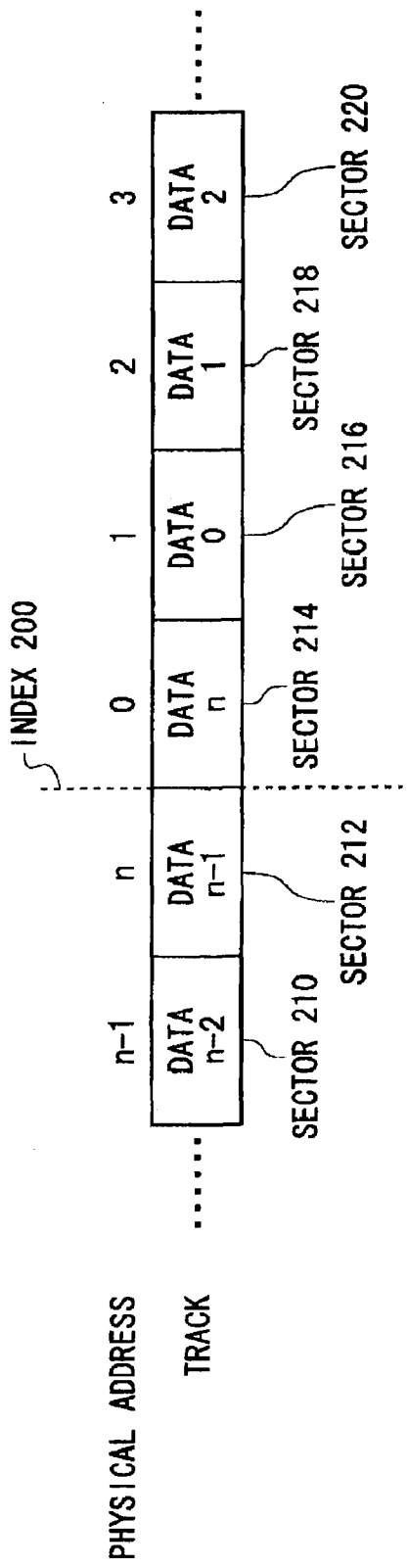
FIG. 2 shows an example writing of data into a magnetic disk 20.

FIG. 2 shows an example writing of data into the magnetic disk 20 performed by the magnetic disk controller 10. In some implementations, the magnetic disk controller 10 stores the first error check code for the first writing data, which is generated based on the first writing data and the physical address (e.g., physical address "0") of the first sector (e.g. the sector 214 associated with the physical address "0") subsequent to the index 200 detected by the index detecting unit 105, onto the sector 216 associated with the physical address "1" which follows the first sector. In addition, the magnetic disk controller 10 writes the first physical address and the first writing data of the first sector 214, onto the sector 216 following the first sector 214.

In some other implementations, the magnetic disk controller 10 writes the first error check code, first writing data, and first physical address, not into the sector 216 which immediately follows the first sector (e.g. sector 214), but into a sector (e.g. sector 220) which follows sector 214 by a predetermined number of sectors. In the same manner, the magnetic disk controller 10 stores data in terms of the sectors 210, 212, 216, 218 and 220.

Figure 3:
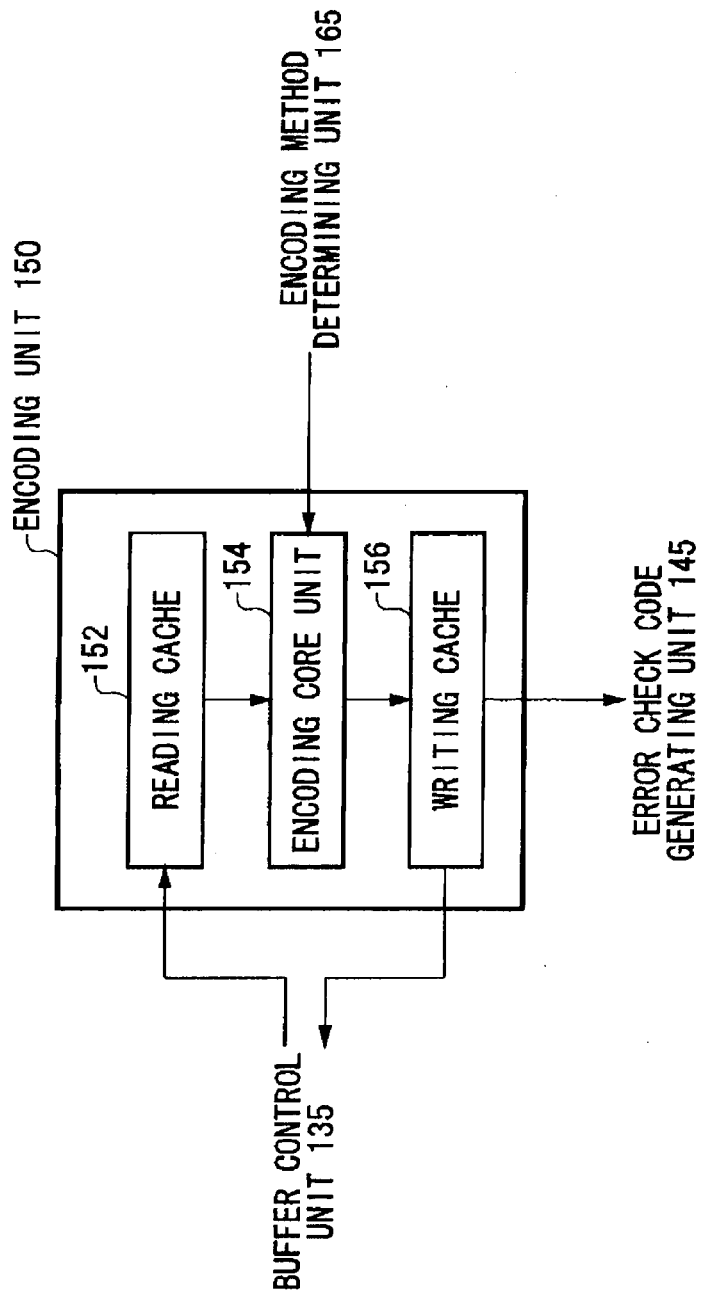
FIG. 3 is a block diagram showing an example encoding unit 150.

FIG. 3 shows an example encoding unit 150. The encoding unit 150 includes a reading cache 152, an encoding core unit 154 and a writing cache 156. The reading cache 152 reads the data stored on the buffer included in the buffer unit 140, in units of the data width M, through the buffer control unit 135. The reading cache 152 then divides the read data having the data width M into pieces of data, each piece of data having a data width smaller than the data width M, and outputs the pieces of data to the encoding core unit 154.

The encoding core unit 154 encodes the data. The encoding core unit 154 encodes the data received from the reading cache 152 using the encoding method determined by the encoding method determining unit 165. The encoding core unit 154 provides the encoded data to the writing cache 156. The writing cache 156 combines pieces of data, which are received one at a time from the encoding core unit 154, and then writes the data into the buffer included in the buffer unit 140 in units of data width M. The writing cache 156 also provides the data received from the encoding core unit 154 to the error check code generating unit 145.

Figure 4:
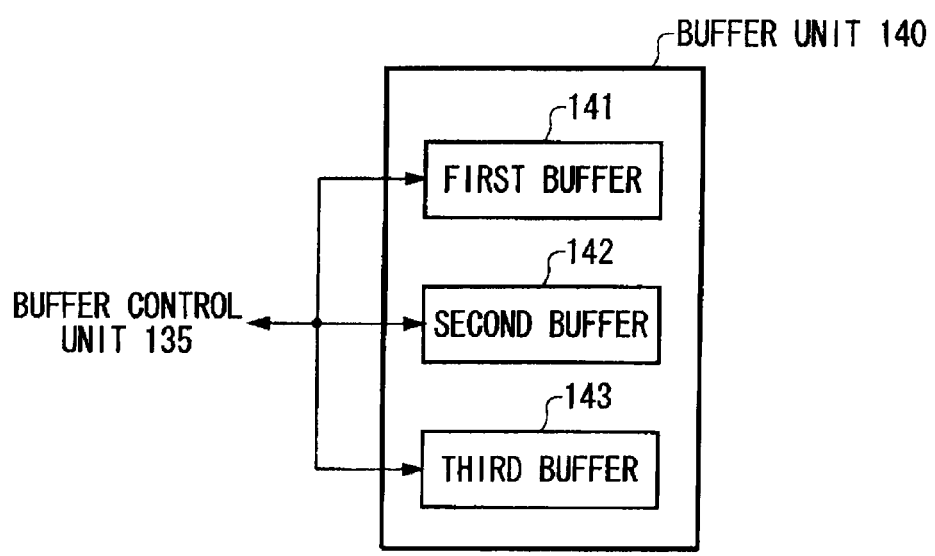
FIG. 4 is a block diagram showing an example buffer unit 140.

FIG. 4 shows an example buffer unit 140. The buffer unit 140 includes a first buffer 141, a second buffer 142 and a third buffer 143. The first, second and third buffers 141, 142 and 143 are respectively controlled by the buffer control unit 135 to store data. In addition, the first, second and third buffers 141, 142 and 143 are respectively controlled by the buffer control unit 135 to provide data to the buffer control unit 135. Each of the first, second, and third buffers 141, 142 and 143 can temporarily store data to be written into at least one sector of the magnetic disk 20, where the data is received from the interface 160. Also, each of the first, second, and third buffers 141, 142 and 143 can temporarily store encoded data corresponding to at least one sector.

For example, the first buffer 141 stores a first writing data, which has been encoded by the encoding unit 150 and is to be written into a first sector of the magnetic disk 20, and the error check code for the first writing data, which is generated by the error check code generating unit 145. The first buffer 141 stores the first error check code into successive storage areas, after storing the first writing data, which has been encoded by the encoding unit 150, into successive storage areas.

The second buffer 142 stores a second writing data, which has been encoded by the encoding unit 150 and is to be written into a second sector of the magnetic disk 20, and the error check code for the second writing data, which is generated by the error check code generating unit 145. The second buffer 142 stores the second writing data and second error check code, which are to be written into a second sector subsequent to the first sector of the magnetic disk 20. For example, the second buffer 142 stores thereon the second writing data and second error check code, which are to be written into a second sector that is adjacent and subsequent to the first sector of the magnetic disk.

The third buffer 143 stores a third writing data, which has been encoded by the encoding unit 150 and is to be written into a third sector of the magnetic disk 20, and the error check code for the third writing data, which is generated by the error check code generating unit 145. The third buffer 143 stores the third writing data and third error check code, which are to be written into a third sector subsequent to the second sector of the magnetic disk 20. For example, the third buffer 143 stores the third writing data and third error check code, which are to be written into a third sector that is adjacent and subsequent to the second sector of the magnetic disk 20.

In the buffer unit 140 described above, the buffer control unit 135 controls, in a first time period, a first writing data and a first error check code stored on the first buffer 141 to be written into a first sector of the magnetic disk 20, concurrently with controlling a second writing data which has been encoded by the encoding unit 150 and a second error check code generated by the error check code generating unit 145 to be stored onto the second buffer 142. Here, the buffer control unit 135 may read and output, one at a time and alternately, portions of the first writing data stored on the first buffer 141 and portions of the first error check code stored on the first buffer 141. The buffer control unit 135 causes the output first writing data and first error check code to be written into a first sector of the magnetic disk 20. In this case, the first error check code generated by the error check code generating unit 145 can be stored on the first buffer 141 and written into the first sector of the magnetic disk 20 without being encoded.

In some implementations, when outputting the first error check code and first writing data, the buffer control unit 135 may sequentially insert a predetermined amount of the first error check code into the first writing data at predetermined intervals. For example, say that the first writing data has a data amount of 512 bytes. The buffer control unit 135 partitions the first error check code into pieces of data numbering between 5 to 11 inclusive, and inserts the pieces of data into the first writing data when outputting the first writing data and first error check code. If the first writing data has a data amount of 1,024 bytes, the buffer control unit 135 partitions the first error check code into pieces of data numbering between 8 to 22 inclusive, and inserts the pieces of data into the first writing data when outputting the first writing data and first error check code. If the first writing data has a data amount of 4,096 bytes, the buffer control unit 135 partitions the first error check code into pieces of data numbering between 8 to 22 inclusive, and inserts the pieces of data into the first writing data when outputting the first writing data and first error check code.

The buffer control unit 135 controls, in the first time period, the first writing data and first error check code stored on the first buffer 141 to be written into the first sector of the magnetic disk, and controls the second writing data, which has been encoded by the encoding unit 150, and the second error check code generated by the error check code generating unit 145 to be stored onto the second buffer 142, concurrently with controlling the third writing data, which has not been encoded by the encoding unit 150 to be written into the third buffer 143. In a second time period following the first time period, the buffer control unit 135 controls the second writing data and second error check code stored on the second buffer 142 to be written into the second sector of the magnetic disk 20, concurrently with controlling the third writing data, which has been encoded by the encoding unit 150, and the third error check code generated by the error check code generating unit 145 to be stored onto the third buffer 143, to replace the third writing data which has not been encoded by the encoding unit 150.

Concurrently with the buffer control unit 135 controlling the third writing data, which has not been encoded by the encoding unit 150 to be stored onto the third buffer 143, the encoding method determining unit 165 receives the third writing data and determines the encoding method to be used by the encoding unit 150 to encode the third writing data. In some implementations, the encoding method determining unit 165 determines the encoding method to be one of, for example, return-to-zero (RZ) method, return-to-bias (RB) method, non-return-to-zero (NRZ) method, PM method, PE method, frequency modulation (FM) method and the like. The encoding unit 150 encodes the data stored in the first and second buffers 141 and 142 into encoded data representing signals to be applied to the magnetic disk 20.

In the above-described case, while writing the data received from the interface 160 into at least one of the first and second buffers 141 and 142, the buffer control unit 135 reads data from the other buffer. Following this, the buffer control unit 135 uses the encoding unit 150 to encode the read data, and stores the encoded data into the other buffer. In this case, the data width M between the encoding unit 150 and the first and second buffers 141 and 142 can be equal to or larger than twice the data width N between the interface 160 and the first and second buffers 141 and 142.

The reading cache 152 in the encoding unit 150 reads the data from the first and second buffers 141 and 142 in units of the data width M. The reading cache 152 divides the read data into pieces of data, each piece having a smaller data width than the data width M, and outputs the pieces of data to the encoding core unit 154. Subsequently, the writing cache 156 combines pieces of data which are respectively received on separate occasions from the encoding core unit 154. The writing cache 156 then writes the combined pieces of data in units of the data width M onto one of the first and second buffers 141 and 142.

In some implementations, the magnetic disk controller 10 is configured such that the sum of the data reading cycle from the first and second buffers 141 and 142 to the encoding unit 150 and the data writing cycle from the encoding unit 150 to the first and second buffers 141 and 142 is equal to the data writing cycle from the interface 160 to the first and second buffers 141 and 142.

The writing control unit 110 reads the encoded data from the third buffer 143 and writes the read encoded data into the magnetic disk 20. In some implementations, the magnetic disk controller 10 is configured such that the sum of the data reading cycle from the first and second buffers 141 and 142 to the encoding unit 150 and the data writing cycle from the encoding unit 150 to the first and second buffers 141 and 142 is equal to the data reading cycle from the third buffer 143 to the writing control unit 110.

In some implementations, the buffer control unit 135 controls the first buffer 141 to function in the same manner as the second buffer 142, controls the second buffer 142 to function in the same manner as the third buffer 143, and controls the third buffer 143 to function in the same manner as the first buffer 141. In this way, the buffer control unit 135 can use the first, second and third buffers 141, 142 and 143 in rotation.

Figure 5:
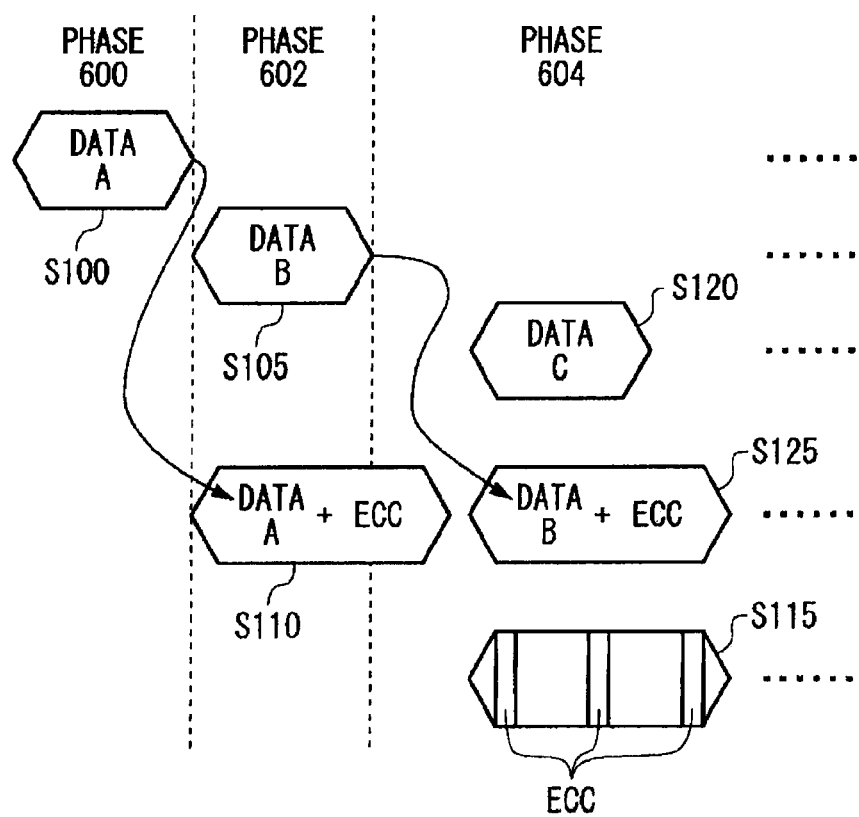
FIG. 5 shows another example writing of data into the magnetic disk 20.

FIG. 5 shows another example writing of data into the magnetic disk 20 performed by the magnetic disk controller 10. Data (e.g. data A) is stored into the first buffer 141 in a phase 600 (S100). Subsequently, data (e.g. data B) is stored into the second buffer 142 in a phase 602 (S105). In synchronization with the timing at which the data is stored into the second buffer 142, the data stored in the first buffer 141 is encoded by the encoding unit 150, and then stored back into the first buffer 141 (S110). Also, an error check code and/or error correction code is generated by the error check code generating unit 145 for the data stored in the first buffer 141, and is stored into the first buffer 141 together with the encoded data (S110).

In a phase 604 following phase 602, the error check code and/or error correction code stored in the first buffer 141 is stored into the magnetic disk 20 together with the data in the first buffer 141 (data A), where the error check code and/or error correction code is partitioned and the partitions are inserted at predetermined intervals (S115). Meanwhile, data (e.g. data C) is stored into the third buffer 143 (S120). In synchronization with the timing at which the data is stored into the third buffer 143, the data stored in the second buffer 142 is encoded by the encoding unit 150, and stored back into the second buffer 142 (S125). Also, an error check code and/or error correction code is generated by the error check code generating unit 145 for the data stored in the second buffer 142, and is stored into the second buffer 142 (S125).

Figure 6:
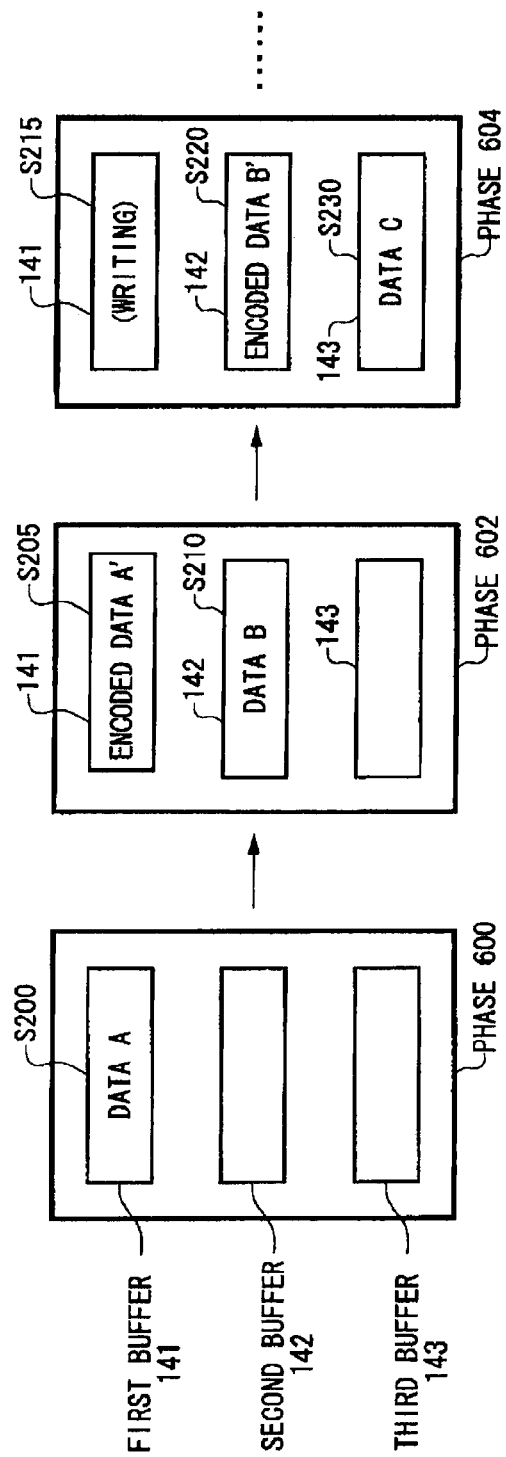
FIG. 6 shows another example writing of data into the magnetic disk 20.

FIG. 6 shows another example writing of data into the magnetic disk 20 performed by the magnetic disk controller 10. The buffer control unit 135 controls data (e.g. data A) to be stored into the first buffer 141 in the phase 600 (S200). In the following phase 602, the data A stored in the first buffer 141 is encoded by the encoding unit 150. The buffer control unit 135 controls the encoded data A' created by the encoding unit 150 to be stored into the first buffer 141 (S205). In synchronization with the timing of storing the encoded data A' into the first buffer 141, the buffer control unit 135 controls data (e.g. data B) to be stored into the second buffer 142 (S210).

In the phase 604, the buffer control unit 135 controls the encoded data A' stored in the first buffer 141 to be written into the magnetic disk 20 (S215). Also, the data B stored in the second buffer 142 is encoded by the encoding unit 150. The buffer control unit 135 controls the encoded data B' created by the encoding unit 150 to be stored into the second buffer 142 (S220). In synchronization with the timing of storing the encoded data B' into the second buffer 142, the buffer control unit 135 controls data (e.g. data C) to be stored into the third buffer 143 (S230).

Figure 7:
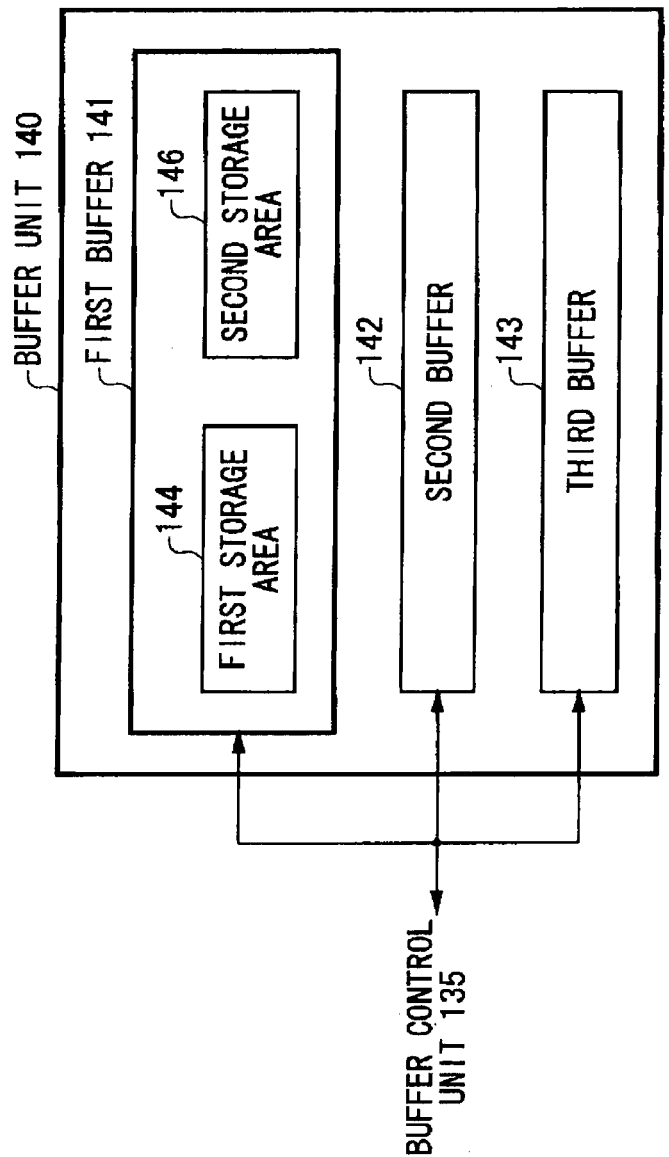
FIG. 7 is a block diagram showing another example buffer unit 140.

FIG. 7 shows another example buffer unit 140. The buffer unit 140 includes the first, second and third buffers 141, 142 and 143. The first buffer 141 includes a first storage area 144 and a second storage area 146.

The first buffer 141 includes the first storage area 144 for storing a former portion (e.g., a former half portion or a "former half-data"), out of a former portion and a latter portion constituting a piece of writing data to be written into a sector of the magnetic disk 20. In addition, the first buffer 141 includes the second storage area 146 for storing the latter portion (e.g., the latter half portion or the "latter half-data") of the former portion and the latter portion. As long as the sum of the data amount of the former portion of a writing data and the data amount of the latter portion of the writing data is equal to the data amount of the writing data to be written into a sector, the data amount of the former portion and the data amount of the latter portion can be different (i.e., the data amounts of the former portion and of the latter portion need not be equal). For convenience, the former portion and the latter portion will be described below as the former half-data and the latter half-data, respectively.

For example, the first buffer 141 stores the former half-data of a first writing data, received from the buffer control unit 135, into the first storage area 144. After this, the first buffer 141 stores the latter half-data of the first writing data, received from the buffer control unit 135, into the second storage area 146. Concurrently with the latter half-data of the first writing data to be written into the first sector of the magnetic disk 20 being stored into the second storage area 146, the encoding unit 150 receives, from the buffer control unit 135, the former half-data of the first writing data, which has been stored in the first storage area 144. Subsequently, the encoding unit 150 encodes the received former half-data into data representing a signal to be applied to the magnetic disk 20.

The second buffer 142 receives the encoded former half-data of the first writing data from the buffer control unit 135 and stores the former half-data therein. After storing therein the encoded former half-data and the latter half-data of the first writing data, the second buffer 142 receives the first error check code for the first writing data, which is generated by the error check code generating unit 145, from the buffer control unit 135, and stores therein the first error check code. For example, after receiving the first writing data, including the encoded former half-data and the latter half-data from the buffer control unit 135 and storing the first writing data into successive storage areas, the second buffer 142 stores the first error check code into successive storage areas.

Then, the buffer control unit 135 controls the former half-data of the first writing data, which is stored in the second buffer 142, to be written into the first sector of the magnetic disk 20. In this case, concurrently with the former half-data of a second writing data to be written into the second sector of the magnetic disk 20 being stored into the first storage area 144, the encoding unit 150 receives the latter half-data of the first writing data, which has been stored on the second storage area 146, from the buffer control unit 135, and encodes the latter half-data. After storing therein the former half-data of the first writing data, the second buffer 142 stores thereon the latter half-data of the first writing data, which has been encoded by the encoding unit 150.

Following this, after controlling the former half-data of the first writing data to be written into the magnetic disk 20, the buffer control unit 135 controls the latter half-data of the first writing data, which is stored on the second buffer 142, to be written into the first sector of the magnetic disk 20. That is, along with the former half-data and latter half-data of the first writing data, the buffer control unit 135 controls the first error check code, which is stored in the second buffer 142, to be written into the first sector of the magnetic disk 20. For example, the buffer control unit 135 reads and outputs, one at a time and alternately, portions of the first writing data and first error check code, which are stored in the second buffer 142. Then, the buffer control unit 135 controls the output of the first writing data and first error check code to be written into the first sector of the magnetic disk 20.

In this case, the first error check code generated by the error check code generating unit 145 may be stored into the second buffer 142 and written into the first sector of the magnetic disk 20 without being encoded. When outputting the first error check code and first writing data, the buffer control unit 135 may insert a predetermined data amount of the first error check code into the first writing data at predetermined intervals.

Concurrently with the latter half-data of the second writing data being stored into the second storage area 146, the encoding unit 150 receives the former half-data of the second writing data, which has been stored on the first storage area 144, from the buffer control unit 135 and encodes the former half-data. After this, concurrently with the former half-data of the third writing data to be written onto the third sector of the magnetic disk 20 being stored into the first storage area 144, the encoding unit 150 encodes the latter half-data of the second writing data, which has been stored in the second storage area 146.

After receiving the former half-data of the second writing data, which has been encoded by the encoding unit 150, from the buffer control unit 135 and storing therein the former half-data, the third buffer 143 receives the latter half-data of the second writing data, which has been encoded by the encoding unit 150, from the buffer control unit 135 and store therein the latter half-data. Subsequently, after controlling the first writing data, which is stored in the second buffer 142, to be written into the first sector, the buffer control unit 135 controls the second writing data, which is stored in the third buffer 143, to be written into the second sector.

The encoding method determining unit 165 determines encoding methods to be used by the encoding unit 150 to encode the one or more pieces of writing data to be written into one or more sectors of the magnetic disk 20, so that each of the encoding methods corresponds to the former half-data or latter half-data of a corresponding one of the one or more pieces of writing data. That is, concurrently with the former half-data of the first writing data being stored onto the first storage area 144, the encoding method determining unit 165 receives the former half-data of the first writing data, and determines the encoding method to be used by the encoding unit 150 to encode the former half-data of the first writing data. Furthermore, concurrently with the latter half-data of the first writing data being stored onto the second storage area 146, the encoding method determining unit 165 receives the latter half-data of the first writing data, and determines the encoding method to be used by the encoding unit 150 to encode the latter half-data of the first writing data.

Figure 8:
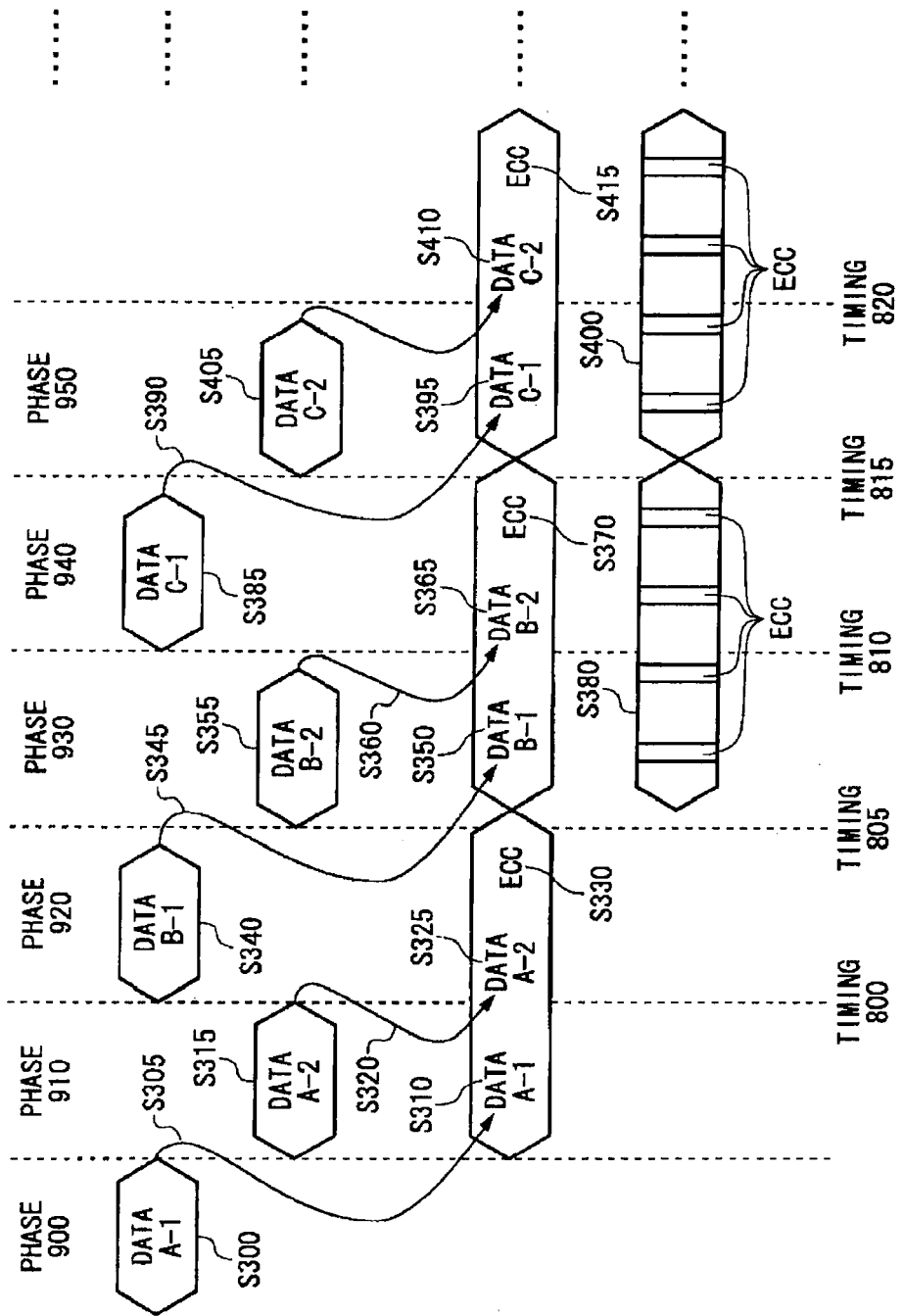
FIG. 8 shows another example writing of data into the magnetic disk 20.

FIG. 8 shows another example writing of data into the magnetic disk 20 performed by the magnetic disk controller 10. In a phase 900, the buffer control unit 135 stores former half-data (e.g. data A-1) into the first storage area 144 (S300). In the following phase 910, the buffer control unit 135 controls the data A-1, which is stored in the first storage area 144, to be encoded by the encoding unit 150, and controls the encoded data A-1 to be stored into the second buffer 142 (S305 and S310). Also, the buffer control unit 135 controls the encoded data A-1 to be provided from the encoding unit 150 to the error check code generating unit 145.

Also, in the phase 910, the buffer control unit 135 controls latter half-data (e.g. data A-2, where the data A-1 and data A-2 together form one piece of data A) to be stored into the second storage area 146 (S315). At a timing 800 between the phase 910 and a phase 920, the buffer control unit 135 controls the data A-2, which is stored in the second storage area 146 to be encoded by the encoding unit 150, and controls the encoded data A-2 to be stored into the second buffer 142 (S320 and S325). Also, the buffer control unit 135 controls the encoded data A-2 to be provided from the encoding unit 150 to the error check code generating unit 145.

In the following phase 920, the buffer control unit 135 controls data B-1, which is a different former half-data from the half-data A-1, to be stored into the first storage area 144 (S340). Meanwhile, the error check code generating unit 145 generates an error check code and/or error correction code based on the encoded data A-1 and data A-2. The buffer control unit 135 stores the error check code and/or error correction code generated by the error check code generating unit 145 into the second buffer 142 (S330).

At a timing 805 between the phase 920 and a phase 930, the buffer control unit 135 stores data B-2 (the data B-1 and data B-2 together form one piece of data B), which is a different latter half-data from the data A-2, into the second storage area 146 (S355). Meanwhile, the buffer control unit 135 controls the data B-1, which is stored on the first storage area 144, to be encoded by the encoding unit 150, and controls the encoded data B-1 to be stored into the second buffer 142 (S345 and S350). Also, the buffer control unit 135 controls the encoded data B-1 to be provided from the encoding unit 150 to the error check code generating unit 145.

At the timing 805, before storing the encoded data B-1 into the second buffer 142, the buffer control unit 135 controls the encoded data A-1 and A-2 and the error correction code and/or error check code (where the error correction code and/or error check code is generated based on the encoded data A-1 and A-2), which are stored in the second buffer 142, to be output and written into the magnetic disk 20. In this case, the buffer control unit 135 partitions the error check code and/or error correction code into pieces of data and writes the pieces of data into a writing area of the magnetic disk 20 at predetermined intervals (S380).

Subsequently, at a timing 810 between the phase 930 and a phase 940, the buffer control unit 135 controls the data B-2, which is stored in the second storage area 146, to be encoded by the encoding unit 150, and controls the encoded data B-2 to be stored into the second buffer 142 (S360 and S365). The buffer control unit 135 also controls the encoded data B-2 to be provided from the encoding unit 150 to the error check code generating unit 145. Furthermore, the buffer control unit 135 stores data C-1, which is a different former half-data from the data A-1 or data B-1, into the first storage area 144 at the timing 810 (S385).

In the phase 940, the error check code generating unit 145 generates an error check code and/or error correction code based on the encoded data B-1 and encoded data B-2. The buffer control unit 135 stores the error check code and/or error correction code, which is generated by the error check code generating unit 145, into the second buffer 142 (S370).

Subsequently, at a timing 815 between the phase 940 and a phase 950, the buffer control unit 135 stores data C-2 (the data C-1 and data C-2 together form one piece of data C), which is a different latter half-data from the data A-2 or data B-2, into the second storage area 146 (S405). Meanwhile, the buffer control unit 135 controls the data C-1, which is stored in the first storage area 144, to be encoded by the encoding unit 150, and controls the encoded data C-1 to be stored into the second buffer 142 (S390 and S395). Also, the buffer control unit 135 controls the encoded data C-1 to be provided from the encoding unit 150 to the error check code generating unit 145.

Here, before storing the encoded data C-1 onto the second buffer 142, the buffer control unit 135 controls the encoded data B-1 and B-2 and the error correction code and/or error check code (where the error correction code and/or error check code is generated based on the encoded data B-1 and B-2), which are stored in the second buffer 142, to be output and written into the magnetic disk 20. In this case, the buffer control unit 135 partitions the error check code and/or error correction code into pieces of data and writes the pieces of data into a writing area of the magnetic disk 20 at predetermined intervals (S400).

Subsequently, at a timing 820 between the phase 950 and the next phase, the buffer control unit 135 controls the data C-2, which is stored in the second storage area 146, to be encoded by the encoding unit 150, and controls the encoded data C-2 to be stored into the second buffer 142 (S410). Also, the buffer control unit 135 controls the encoded data C-2 to be provided from the encoding unit 150 to the error check code generating unit 145. Here, in the phase subsequent to the phase 950, the error check code generating unit 145 generates an error check code and/or error correction code based on the encoded data C-1 and encoded data C-2. The buffer control unit 135 stores the error check code and/or error correction code generated by the error check code generating unit 145 into the second buffer 142 (S415).

As described above, the magnetic disk controller 10 divides one piece of data into former half-data and latter half-data, and encodes each of the former half-data and latter half-data. The magnetic disk controller 10 can partition an error check code and/or error correction code, which is generated based on the encoded former half-data and encoded latter half-data, into pieces of data, and store the pieces of data into the magnetic disk 20 at predetermined intervals.

Figure 9:
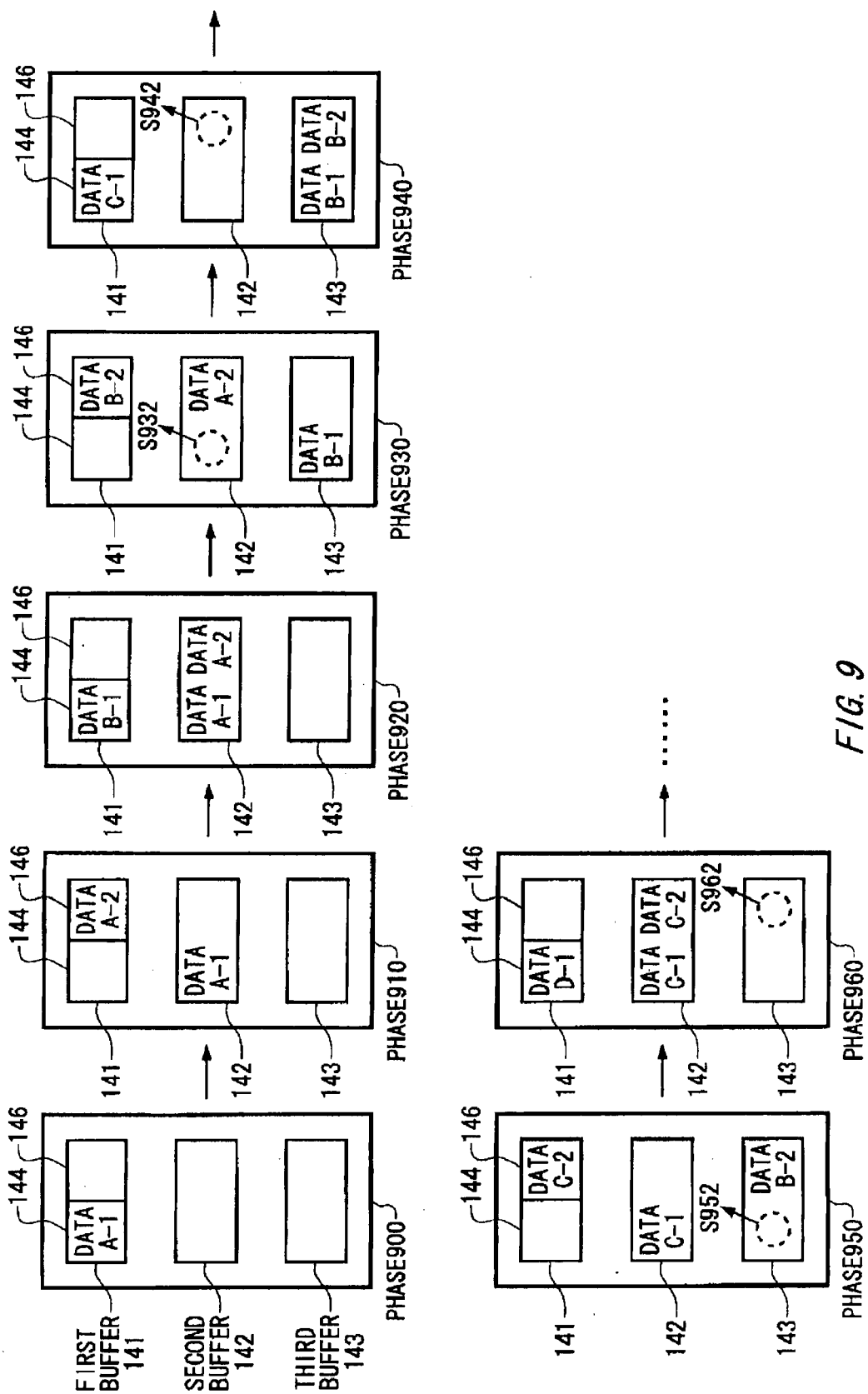
FIG. 9 shows another example writing of data into the magnetic disk 20.

FIG. 9 shows another example writing of data into the magnetic disk 20 performed by the magnetic disk controller 10. In a phase 900, the buffer control unit 135 stores data A-1, which is part of data A, into the first storage area 144 in the first buffer 141. In a phase 910, the buffer control unit 135 controls the data A-1 stored in the first storage area 144 to be encoded by the encoding unit 150, and stores the encoded data A-1 into the second buffer 142. Also, the buffer control unit 135 controls the encoded data A-1 to be provided to the error check code generating unit 145. The buffer control unit 135 also stores data A-2, which is the remaining portion of the data A, into the second storage area 146 in the first buffer 141.

Subsequently in a phase 920, the buffer control unit 135 stores data B-1, which is part of data B, into the first storage area 144. The buffer control unit 135 also controls the data A-2 stored in the second storage area 146 to be encoded by the encoding unit 150, and stores the encoded data A-2 into the second buffer 142. The buffer control unit 135 controls the encoded data A-2 to be provided to the error check code generating unit 145. The error check code generating unit 145 generates an error check code and/or error correction code for the data A based on the encoded data A-1 and encoded data A-2. The buffer control unit 135 stores the error check code and/or error correction code, which is generated by the error check code generating unit 145, into the second buffer 142.

In a phase 930, the buffer control unit 135 stores data B-2, which is the remaining portion of the data B, into the second storage area 146. Also, the buffer control unit 135 controls the data B-1, which is stored in the first storage area 144, to be encoded by the encoding unit 150, and stores the encoded data B-1 into the third buffer 143. The buffer control unit 135 also controls the encoded data B-1 to be provided to the error check code generating unit 145. In the phase 930, the buffer control unit 135 provides the encoded data A-1, which is stored in the second buffer 142, to the writing control unit 110. The writing control unit 110 writes the encoded data A-1 into the magnetic disk 20 (S932).

In the following phase 940, the buffer control unit 135 stores data C-1, which is part of data C, into the first storage area 144. Also, the buffer control unit 135 provides the encoded data A-2, which is stored in the second buffer 142, to the writing control unit 110. The writing control unit 110 writes the encoded data A-2 into the magnetic disk 20 (S942). In this case, the writing control unit 110 also writes the error check code and/or error correction code for the data A, which is stored in the second buffer 142, into the magnetic disk 20.

In addition, the buffer control unit 135 controls the data B-2, which is stored in the second storage area 146, to be encoded by the encoding unit 150, and stores the encoded data B-2 into the third buffer 143. The buffer control unit 135 also provides the encoded data B-2 to the error check code generating unit 145. The error check code generating unit 145 generates an error check code and/or error correction code for the data B, based on the encoded data B-1 and encoded data B-2. The buffer control unit 135 stores the error check code and/or error correction code, which is generated by the error check code generating unit 145, into the third buffer 143.

In a phase 950, the buffer control unit 135 stores data C-2, which is the remaining portion of the data C, into the second storage area 146. Also, the buffer control unit 135 controls the data C-1, which is stored on the first storage area 144, to be encoded by the encoding unit 150, and stores the encoded data C-1 into the second buffer 142. The buffer control unit 135 also provides the encoded data C-1 to the error check code generating unit 145. In the phase 950, the buffer control unit 135 provides the encoded data B-1, which is stored in the third buffer 143, to the writing control unit 110. The writing control unit 110 writes the encoded data B-1 into the magnetic disk 20 (S952).

Subsequently in the following phase 960, the buffer control unit 135 stores data D-1, which is part of data D, into the first storage area 144. Also, the buffer control unit 135 provides the encoded data B-2, which is stored in the third buffer 143, to the writing control unit 110. The writing control unit 110 writes the encoded data B-2 into the magnetic disk 20 (S962).

In this case, the writing control unit 110 also writes the error check code and/or error correction code for the data B, which is stored in the third buffer 143, into the magnetic disk 20.

Also, the buffer control unit 135 controls the data C-2, which is stored in the second storage area 146, to be encoded by the encoding unit 150, and stores the encoded data C-2 into the second buffer 142. The buffer control unit 135 also provides the encoded data C-2 to the error check code generating unit 145. The error check code generating unit 145 generates an error check code and/or error correction code for the data C, based on the encoded data C-1 and encoded data C-2. The buffer control unit 135 stores the error check code and/or error correction code, which is generated by the error check code generating unit 145, into the second buffer 142.

While particular embodiments of the subject matter described in his specification have been described, the technical scope of the subject matter is not limited to the above described embodiments. Other embodiments are within the scope of the following claims. It is apparent to persons skilled in the art that various alternations and improvements can be added to the above-described embodiments. It is also apparent from the scope of the claims that the embodiments added with such alternations or improvements can be included in the technical scope of the subject matter.

What is claimed is:

1. A magnetic disk controller for controlling writing of data into a magnetic disk, comprising:
   an encoding unit that encodes a plurality of pieces of writing data into a plurality of encoded pieces of writing data;
   an error check code generating unit that generates error check codes associated with the encoded pieces of writing data;
   a first buffer that stores a first encoded piece of writing data and a first error check code associated with the first encoded piece, wherein the first encoded piece is encoded by the encoding unit from a first piece of writing data, and wherein the first error check code is generated by the error check code generating unit;
   a second buffer that stores a second encoded piece of writing data and a second error check code associated with the second encoded piece, wherein the second encoded piece is encoded by the encoding unit from a second piece of writing data, and wherein the second error check code is generated by the error check code generating unit; and
   a buffer control unit that,
      in a first period, concurrently with storing the first encoded piece and the first error check code into the first buffer, stores the second piece of writing data into the second buffer, and
      in a second period following the first period, concurrently with a writing of the first encoded piece and the first error check code from the first buffer into a first sector of the magnetic disk, stores the second encoded piece and the second error check code into the second buffer, replacing the second piece of writing data.

2. The magnetic disk controller of claim 1, wherein the first buffer
   stores the first encoded piece in successive storage areas; and
   stores the first error check code in successive storage areas after storing the first encoded piece.

3. The magnetic disk controller of claim 2, wherein the buffer control unit reads and outputs, one at a time and alternately, portions of the first encoded piece stored in the first buffer and portions of the first error check code stored in the first buffer, and writes the output first encoded piece and the output first error check code into the first sector of the magnetic disk.

4. The magnetic disk controller of claim 3, wherein the buffer control unit, when outputting the first encoded piece and the first error check code, sequentially inserts a predetermined amount of the first error check code into the first encoded piece at a predetermined interval.

5. The magnetic disk controller of claim 2, wherein the buffer control unit stores the first error check code in the first buffer, wherein the first error check code is not encoded; and writes the not-encoded first error check code from the first buffer into the first sector of the magnetic disk.

6. The magnetic disk controller of claim 1, wherein the buffer control unit stores the first encoded piece and the first error check code in the first buffer, wherein the first encoded piece and the first error check code is written into the first sector of the magnetic disk, and stores the second encoded piece and the second error check code in the second buffer, wherein the second encoded piece and the second error check code is written into a second sector of the magnetic disk, wherein the second sector is subsequent to the first sector of the magnetic disk.

7. The magnetic disk controller of claim 6, wherein the second sector of the magnetic disk is adjacent to the first sector of the magnetic disk.

8. The magnetic disk controller of claim 1, further comprising:

a third buffer that stores a third encoded piece of writing data and a third error check code associated with the third encoded piece, wherein the third encoded piece is encoded by the encoding unit from a third piece of writing data, wherein the third error check code is generated by the error check code generating unit; and wherein the buffer control unit in the second period, concurrently with a writing of the first encoded piece and the first error check code from the first buffer into the first sector of the magnetic disk and storing the second encoded piece and the second error check code into the second buffer, stores the third piece of writing data into the third buffer; and in a third period following the second period, concurrently with a writing of the second encoded piece and the second error check code from the second buffer into the second sector of the magnetic disk, stores the third encoded piece and the third error check code into the third buffer, replacing the third piece of writing data.

9. The magnetic disk controller of claim 8, wherein:

the first buffer stores the first encoded piece and the first error check code, wherein the first encoded piece and the first error check code are to be written into the first sector of the magnetic disk, the second buffer stores the second encoded piece and the second error check code, wherein the second encoded piece and the second error check code are to be written into the second sector of the magnetic disk, wherein the second sector is subsequent to the first sector of the magnetic disk, and the third buffer stores the third encoded piece and the third error check code, wherein the third encoded piece and the third error check code are to be written into a third sector of the magnetic disk, wherein the third sector is subsequent to the second sector of the magnetic disk.

10. The magnetic disk controller of claim 9, wherein:

the second sector is adjacent to the first sector of the magnetic disk, and the third sector is adjacent to the second sector of the magnetic disk.

11. The magnetic disk controller of claim 9, further comprising an encoding method determining unit operable to determine an encoding method, wherein the encoding unit is operable to use the encoding method to encode each of the plurality of pieces of writing data.

12. The magnetic disk controller of claim 11, wherein the encoding method determining unit, concurrently with a storing of the third piece of writing data into the third buffer, receives the third piece of writing data and determines an encoding method to be used by the encoding unit to encode the third piece of writing data.

13. The magnetic disk controller of claim 1, wherein the error check code generating unit generates error correction codes associated with the encoded pieces of writing data.

14. A method comprising:

sequentially encoding a plurality of pieces of writing data into a plurality of encoded pieces of writing data, the plurality of encoded pieces of writing data comprising a first encoded piece of writing data and a second encoded piece of writing data;

sequentially generating a plurality of error check codes associated with the plurality of encoded pieces of writing data, the plurality of error check codes comprising a first error check code associated with the first encoded piece and a second error check code associated with the second encoded piece;

concurrently, in a first period:

storing, into a first buffer, the first encoded piece and the first error check code; and storing, into a second buffer, a second piece of writing data, wherein the second encoded piece is encoded from the second piece of writing data and concurrently, in a second period following the first period:

writing the first encoded piece and the first error check code from the first buffer into a first sector of a magnetic disk; and storing the second encoded piece and the second error check code into the second buffer, replacing the second piece of writing data.

15. A system comprising:

means for sequentially encoding a plurality of pieces of writing data into a plurality of encoded pieces of writing data, the plurality of encoded pieces of writing data comprising a first encoded piece of writing data and a second encoded piece of writing data;

means for sequentially generating a plurality of error check codes associated with the plurality of encoded pieces of writing data, the plurality of error check codes comprising a first error check code associated with the first encoded piece and a second error check code associated with the second encoded piece;

means for, in a first period, storing, into a first buffer, the first encoded piece and the first error check code, and concurrently with the storing of the first encoded piece and the first error check code into the first buffer, storing a second piece of writing data into a second buffer, wherein the second encoded piece is encoded from the second piece of writing data means for, in a second period, writing the first encoded piece and the first error check code from the first buffer into a first sector of a magnetic disk; and concurrently with the writing, storing the second encoded piece and the second error check code into the second buffer, replacing the second piece of writing data.

* * * * *